United States Patent [19]

Tsu

[11] Patent Number: 5,432,128
[45] Date of Patent: Jul. 11, 1995

[54] RELIABILITY ENHANCEMENT OF ALUMINUM INTERCONNECTS BY REACTING ALUMINUM LEADS WITH A STRENGTHENING GAS

[75] Inventor: Robert Tsu, Dallas, Tex.

[73] Assignee: Texas Instruments Incorporated, Dallas, Tex.

[21] Appl. No.: 250,062

[22] Filed: May 27, 1994

[51] Int. Cl.⁶ .......................................... H01L 21/44
[52] U.S. Cl. .................... 437/194; 437/195; 437/197; 437/245
[58] Field of Search ................ 437/195, 245, 194, 197

[56] References Cited

U.S. PATENT DOCUMENTS

| | | | |
|---|---|---|---|
| 3,887,994 | 6/1975 | Ku et al. | 29/571 |
| 4,920,077 | 4/1990 | Mora | 437/240 |
| 4,987,101 | 1/1991 | Kaanta et al. | 437/228 |
| 5,103,288 | 4/1992 | Sakamoto et al. | 357/71 |

OTHER PUBLICATIONS

Yasuhiro Kurokawa, Hiroyuki Hamaguchi, Yuzo Shimada, Kazuaki Utsumi and Hideo Takamizawa, "Highly Thermal Conductive Aluminum Nitride Substrates", ISHM '87 Proceedings, pp. 654–661.

Jochen Fricke and Andreas Emmerling, "Aerogels", May 28, 1992, J. Am. Seram. Soc. 75(8)pp. 2027–2036.

James F. Shackelford and William Alexander, "The CRC Materials Science And Engineering Handbook", p. 336 and 338, (CRC Press, 1992).

"Standard Method of Test For Young's Modulus At Room Temperatures", ASTM E111-61, op-cit., pp. 1–6.

W. D. Kingery, H. K. Bowen, and D. R. Uhlmann, "Introduction to Ceramics", 2nd Ed., p. 777 (John Wiley & Sons, New York, 1976).

T. Osaka, T. Asada, E. Nakajima, and I. Koiwa, "Chemical Etching Properties of Highly Thermal Conductive AIN Ceramic For Electroless Ni-P Metallization", J. Electrochem. Soc.: Solid State Science an Technol., 135, 2578–2581 (1988).

Wolf & Tauber "Silicon Process for the VLSI Era" vol. 1 Lattice Press pp. 57–58.

Primary Examiner—Brian E. Hearn
Assistant Examiner—Trung Dang
Attorney, Agent, or Firm—Kay Houston; James C. Kesterson; Richard L. Donaldson

[57] ABSTRACT

This invention encompasses using a strengthened shell to enhance reliability of aluminum leads of a semiconductor device. The invention includes depositing an aluminum layer on a substrate 12, etching the aluminum layer in a predetermined pattern to form aluminum leads 16, exposing the aluminum leads 16 to a strengthening gas to react and form a strengthened shell 18 on the aluminum leads 16, and depositing a dielectric layer 20 over the strengthened shell 18 and the substrate 12. The strengthening gas may contain nitrogen, oxygen, or both. The exposing step may also comprise a rapid thermal anneal, and the dielectric layer 20 is preferably comprised of a material having a dielectric constant of less than 3. An advantage of the invention is to mechanically strengthen the aluminum leads of a semiconductor wafer. In addition, it is an intrinsic operation, rather than extrinsic; the basic material required is already present on the wafer, it is merely altered.

14 Claims, 4 Drawing Sheets

RELIABILITY ENHANCEMENT OF ALUMINUM INTERCONNECTS BY REACTING ALUMINUM LEADS WITH A STRENGTHENING GAS

CROSS-REFERENCE TO RELATED APPLICATIONS

U.S. Patent Application, TI case T19068, entitled *Method of Forming a Low Dielectric Constant Insulation in VLSI Applications*, fried on Apr. 28, 1994 by Cho; and U.S. Patent Application, TI case T19109, entitled *Suppression of Interlead Leakage When Using Air Gap Dielectric*, fried concurrently with this application by Tigelaar et al.

FIELD OF THE INVENTION

This invention relates generally to the fabrication of semiconductor devices, and more specifically to semiconductors with submicron spacing between aluminum leads and low-dielectric constant materials.

BACKGROUND OF THE INVENTION

Semiconductors are widely used in integrated circuits for electronic applications, including radios and televisions. Such integrated circuits typically use multiple transistors fabricated in single crystal silicon. Many integrated circuits now contain multiple levels of metallization for interconnections. Semi-conductor devices are being scaled in the horizontal dimension to reduce wafer cost by obtaining more chips per wafer or by increasing circuit complexity, getting more transistors per chip.

SUMMARY OF THE INVENTION

Although semiconductor devices are being scaled in the horizontal dimension to submicron (less than 1 micrometer) levels, metal leads are not necessarily being scaled in the vertical dimension. The reason for this is that as metal leads are scaled in the horizontal direction, the current density of the leads increases. If the metal leads were also scaled in the vertical dimension, the current density would exceed reliability limits. With horizontal scaling, these tall metal leads are being packed closer and closer together, causing capacitive coupling between the leads to become the primary limitation to circuit speed.

Low-dielectric constant materials are being investigated for use with closely-spaced metal leads, including organic SOG (spin-on glass), polyimides, amorphous teflon, aerogels, air gaps, or vacuum gaps. These materials typically do not have the mechanical strength of traditionally-used $SiO_2$. During the fabrication of a device structure, a wafer may be exposed to wet processing and chemical-mechanical polishing (CMP), which impose high mechanical stress and KOH-based slurry during etching. The end result of these processing steps on a wafer without proper structural support can be device failures and decreased yields.

Aluminum is commonly used for metallization layers in ULSI semiconductors. The combination of weak aluminum conductors surrounded by low-dielectric constant materials (having low structural strength) has herein been discovered to be a problem.

The present invention solves this hereto unrecognized problem. While the low-dielectric constant materials cannot easily be strengthened, surprisingly, the aluminum leads can relatively easily be strengthened, using gaseous processing. The invention encompasses using a strengthening gas to react with aluminum leads to form a strengthened shell, which enhances the reliability of metallic interconnects on a semiconductor device having submicron spacing between aluminum leads and a low-dielectric constant material.

The invention may involve depositing an aluminum layer on a substrate, etching the aluminum layer in a predetermined pattern to form aluminum leads, exposing the aluminum leads to a strengthening gas to form a strengthened shell on the aluminum leads, and depositing a dielectric layer of a material having a dielectric constant less than 3 over the strengthened shell and the substrate. The strengthening gas may contain nitrogen, oxygen, or both. The exposing step may also comprise a rapid thermal anneal.

An advantage of the invention is to mechanically strengthen the aluminum leads of a semiconductor wafer. In addition, it is an intrinsic operation, rather than extrinsic; the basic material required is already present on the wafer and is merely altered.

BRIEF DESCRIPTION OF THE DRAWINGS

In the drawings, which form an integral part of the specification and are to be read in conjunction therewith, and in which like numerals and symbols are employed to designate similar components in various views unless otherwise indicated.

DETAILED DESCRIPTION OF PREFERRED EMBODIMENTS

The making and use of the presently preferred embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not delimit the scope of the invention.

The following is a description of several preferred embodiments and alternative embodiments, including manufacturing methods. Corresponding numerals and symbols in the different figures refer to corresponding parts unless otherwise indicated. Table 1 below provides an overview of the elements of the embodiments and the drawings.

TABLE 1

| Drawing Element | Preferred or Specific Examples | Generic Term | Other Alternate Examples or Descriptions |
|---|---|---|---|
| 10 | | Semiconductor wafer | |
| 12 | Silicon | Substrate | Silicon dioxide; Oxide layer; May be other metal interconnect layers or semiconductor elements, (e.g. transistors, diodes); Compound semiconductors (e.g. GaAs, InP, Si/Ge, SiC). |
| 14 | $SiO_2$ | Insulating layer | TEOS, PETEOS, BPSG (boron phosphate, silicate glass), other dielectric materials; oxide layer. |
| 16 | Aluminum | Aluminum leads | Alloys of Al, Cu, Mo, W, Ti; Titanium trilayer (TiN/AlCu/TiN); AlCu alloy with Ti or TiN underlayers; Metal interconnect layer. |
| 18 | AlN | Strengthened shell | $Al_2O_3$; AlON; a metal strengthened with oxygen, nitrogen, or both (e.g. $N_2O$, $O_3$, $NH_3$) |
| 19 | $Si_3N_4$ | Strengthened insulating layer | Strengthened substrate; strengthened oxide; an insulator strengthened with oxygen, nitrogen, or both. |
| 20 | $SiO_2$ | Dielectric layer | Spin-on Glass (SOG), doped SOG, polyimides, amorphous teflon, aerogels; other low-dielectric constant materials with a dielectric constant less than ins of $SiO_2$; a dielectric material that leaves gas (e.g. air gaps) or vacuum gaps adjacent aluminum leads when applied. |
| 22 | | Air gap | Vacuum gap, other gas. |
| 24 | CVD oxide | Thin oxide layer | TEOS, $SiO_2$, PETEOS, BPSG (boron phosphate silicate glass), other dielectric materials; oxide layer. |
| 26 | SOG | Thick oxide layer | |
| 27 | | Via | |
| 28 | Al | Second aluminum layer | Titanium trilayer (TiN/AlCu/TiN); Alloys of Al, Cu, Mo, W, Ti; Polysilicon, silicides, nitrides, carbides; AlCu alloy with Ti or TiN underlayers; Metal interconnect layer. |
| 30 | AlO | Native Oxide | Other native oxide depending on type of metal used for aluminum leads 16. |

Figure 1A:
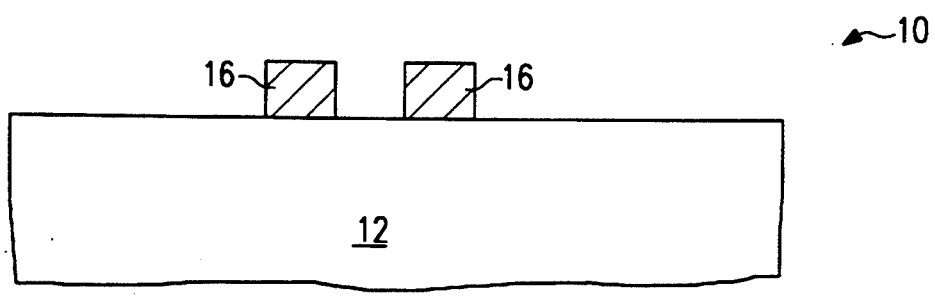
FIGS. 1a to FIG. 1c are cross-sectional views of a semiconductor wafer, showing a preferred embodiment of the present invention.

FIG. 1 is a cross-sectional view of a semiconductor wafer on which the present invention has been performed. FIG. 1a shows semiconductor wafer 10 with a substrate 12 which may, for example, contain transistors, diodes, and other semiconductor elements (not shown) as are well known in the art. The substrate 12 may also contain other metal interconnect layers. An aluminum interconnect layer has been deposited over substrate 12. The aluminum interconnect layer has been etched in a predetermined pattern to form etch lines, or aluminum leads 16. Some of the aluminum leads 16 are in close proximity to each other, e.g. less than one micrometer apart. The aluminum leads in ULSI technology (Ultra Large Scale Integration) are typically 0.1 to 0.8 micrometers apart, 0.1 to 0.8 micrometers in width, and have a height of 3 to 4 times the width (giving an aspect ratio of 3:1 to 4:1). It has been found that the tall, thin aluminum leads in ULSI technology are mechanically weak.

Figure 1B:
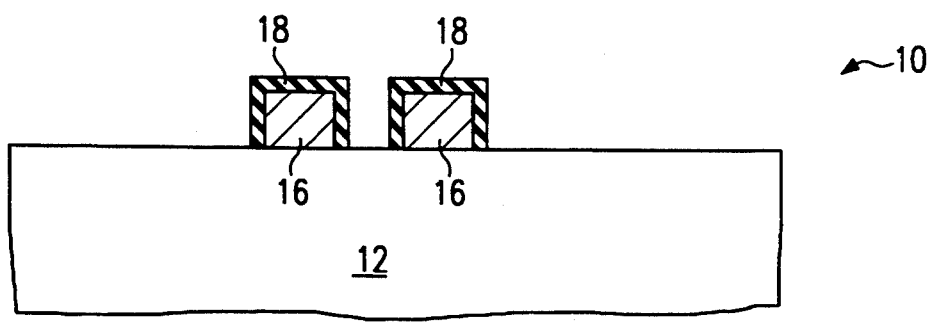

FIG. 1b shows the wafer 10 after a strengthened shell 18 has been formed over aluminum leads 16. Strengthened shell 18 is thin and is preferably formed by exposing the aluminum leads 16 to a nitrogen-containing strengthening gas in order to react with the aluminum leads and form a strengthened shell. In the preferred embodiment, rapid thermal annealing is employed using $NH_3$ as the strengthening gas. The resultant strengthened shell 18 can be comprised of, for example, AlN, and is typically 40 to 50 Å thick; approximately twice the thickness of a native oxide, which is generally 20 to 30 Å. Alternately, the aluminum leads 16 may be strengthened by exposure to an oxygen-containing gas, such as $N_2O$, $O_2$, or $O_3$ to form a strengthened shell 18 of $Al_2O_3$.

Figure 1C:
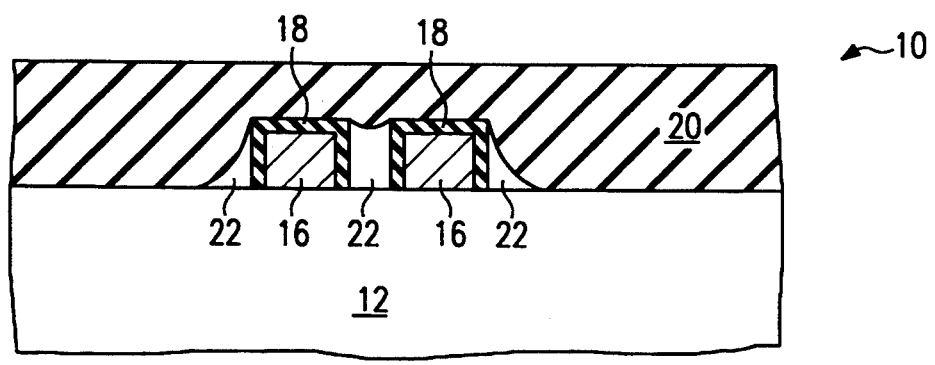

As shown in FIG. 1c, dielectric layer 20 may then be deposited over strengthened shell 18 and substrate 12. The dielectric layer 20 of this invention is preferably comprised of a low-dielectric constant material, e.g. a dielectric material having a dielectric constant less than that of $SiO_2$. The dielectric material shown in FIG. 1c is a viscous material that has left air gaps 22 adjacent the strengthening aluminum leads, whereby the air gaps provide a low dielectric medium between the closely-spaced aluminum leads 16.

Figure 2A:
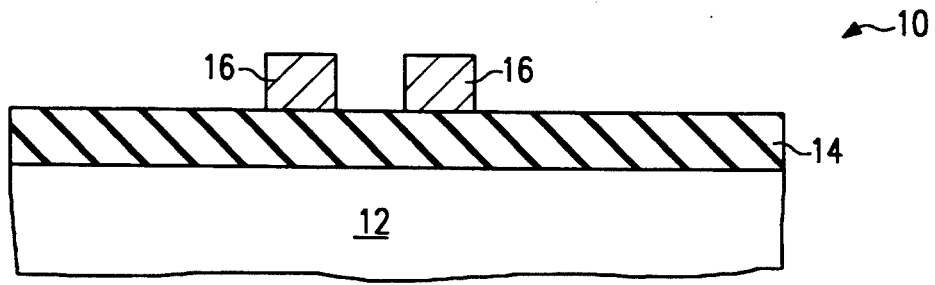
FIGS. 2a to 2c are cross-sectional views of a semiconductor wafer, showing another embodiment of the present invention.

FIG. 2 is a cross-sectional view of a semiconductor wafer showing an alternate embodiment of the present invention. FIG. 2a shows semiconductor wafer 10 with a substrate 12. Insulating layer 14 has been deposited over the substrate 12 and preferably comprises $SiO_2$. Insulating layer 14 could also comprise PETEOS (plasma-enhanced tetraethosiloxane), BPSG (boron phosphate silicate glass) or other dielectric materials. An aluminum interconnect layer has been deposited over insulating layer 14 and has been etched in a predetermined pattern to form aluminum leads 16.

Figure 2B:
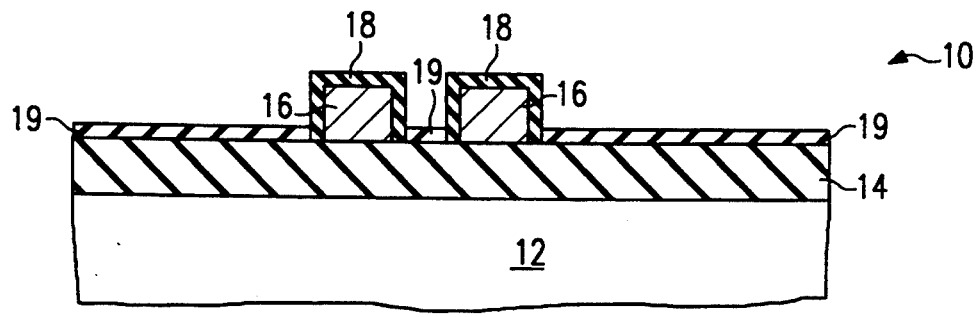

FIG. 2b shows the wafer 10 after a strengthened shell 18 has been formed over aluminum leads 16 by exposing the wafer to a strengthening gas. The strengthening gas may also react with the exposed portions of insulating layer 14 to form a strengthened insulating layer 19. Like the strengthened shell, the strengthened insulating layer 19 is thin, typically 40 to 50 Å.

Figure 2C:
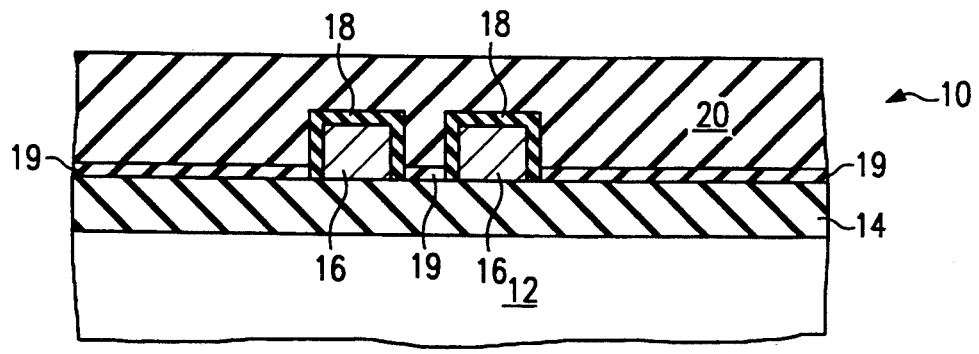

Next, dielectric layer 20 is deposited on strengthened shell 18 and strengthened insulating layer 19, as shown in FIG. 2c. The dielectric layer 20 shown in FIG. 2c is a low-dielectric constant material (rather than forming air gaps when applied; however, the material used for the first embodiment could also be used, leaving air gaps between closely-spaced aluminum leads and adjacent to aluminum leads).

In both embodiments shown in FIGS. 1 and 2, subsequent processing steps may then performed as shown in FIG. 3. FIG. 3a shows the aluminum leads 16 with strengthened shell 18, formed as described for FIGS. 1 and 2. FIG. 3b shows the wafer after the dielectric layer 20 has been deposited. The dielectric layer 20 of the wafer 10 is then planarized typically by CMP as shown in FIG. 3c. The strengthened shell 18 strengthens the aluminum leads 16, so that the aluminum leads 16 can withstand the rigorous planarization step, and in addition, the strengthened shell 18 may be used as an etch stop.

Figure 3A:
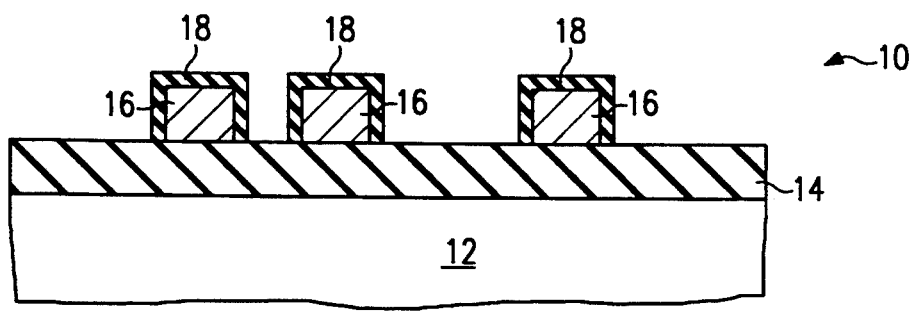
FIGS. 3a to 3f are cross-sectional views of a semiconductor wafer, showing the present invention and typical subsequent processing steps.
Figure 3B:
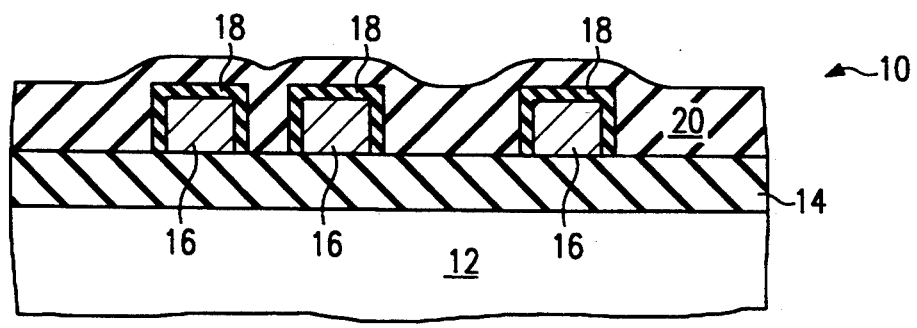
Figure 3C:
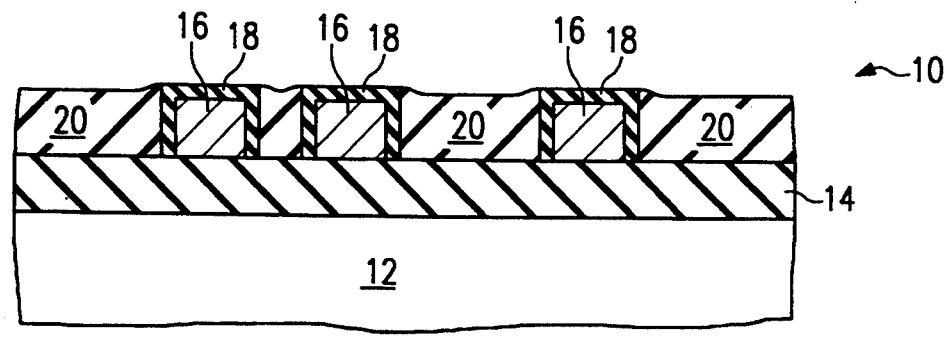
Figure 3D:
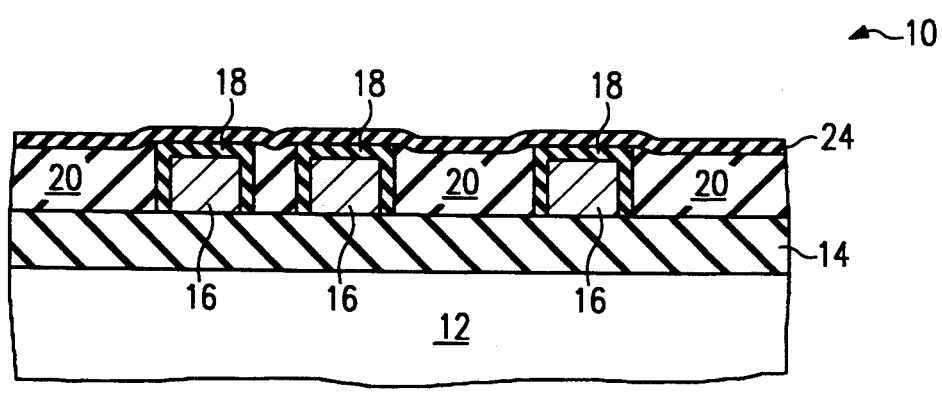
Figure 3E:
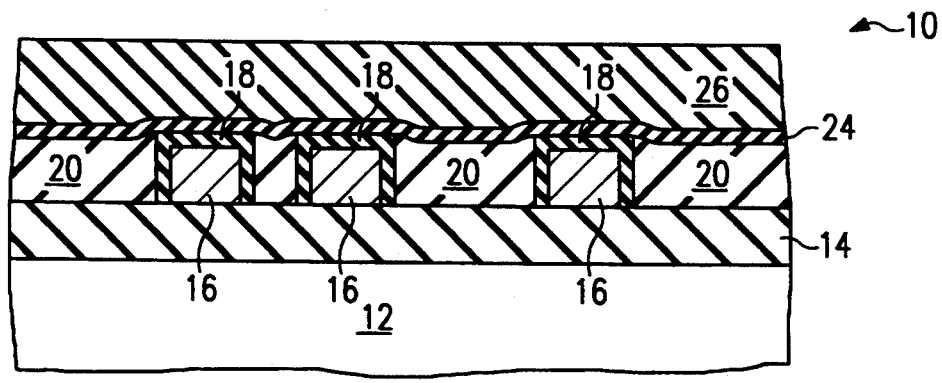
Figure 3F:
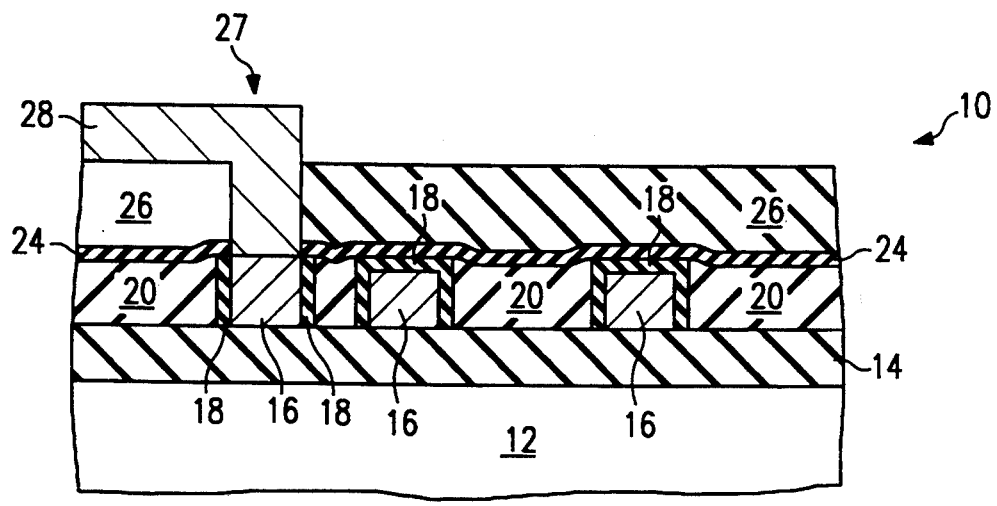

Next, a CVD oxide layer 24 may be grown, and can be comprised, for example, of $SiO_2$, as shown in FIG. 3d. Then, a thick oxide layer 26 is deposited (FIG. 3e) and is preferably made of spin-on glass. The wafer may be patterned and etched to remove the thick oxide layer 26, the thin oxide layer 24, and the strengthened shell 18 in predetermined locations. These predetermined locations may create vias, such as via 27 shown in FIG. 3f, that is a hole to the first aluminum layer containing aluminum leads 16. Then a second aluminum layer 28 is deposited which fills via 27 to contact the aluminum leads 16 of the first aluminum layer.

There am many alternatives involved in using the present invention. The present invention can be used on semiconductors using a variety of low-dielectric constant materials. To reduce capacitive coupling for closely-spaced leads, low-dielectric constant materials are being investigated, such as pure polymers (e.g. parylene, teflon, polyimide) or organic spin-on glass (OSOG, e.g. silsequioxane and siloxane glass). Refer to U.S. Pat. No. 4,987,101 issued to Kaanta et al on Jan. 22, 1991 which describes a method for fabricating gas (air) dielectrics; and U.S. Pat. No. 5,103,288 issued to Sakamoto on Apr. 7, 1992 which describes a multilayered wiring structure which decreases capacitance by using a porous dielectric.

The gas used to form the strengthened shell 18 may contain oxygen, nitrogen, or both. Table 2 shows some possible gases that can be used to form the strengthened shell 18 and the strengthened insulating layer 19. Other techniques may be used to form the strengthening shell, which must result in good conformality of the strengthened layers. The steps shown in FIG. 2 could also be applied to the substrate as shown in FIG. 1.

TABLE 2

| Strengthening Gas | Strengthened Layer | Material Strengthened |
| --- | --- | --- |
| $NH_3$ | AlN | Al |
| $N_2O$ | $Al_2O_3$ | Al |
| $O_2$ | $Al_2O_3$ | Al |
| $NH_3$ | $Si_3N_4$ | $SiO_2$ |
| $O_3$ | $Al_2O_3$ | Al |

Figure 4A:
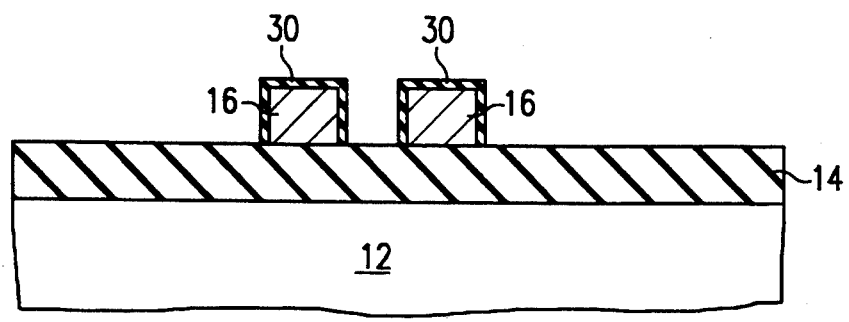
FIGS. 4a to 4b are cross-sectional views of a semiconductor wafer, showing an alternate embodiment of the present invention.
Figure 4B:
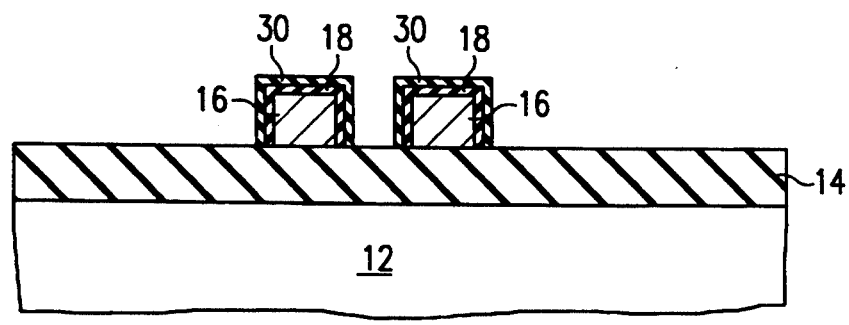

FIG. 4 shows another possible embodiment of the invention. The aluminum leads 14 may have a native oxide 30 resident, from exposure to ambient oxygen (FIG. 4a). Exposure to $NH_3$ gas results in the formation of strengthened shell 18 beneath native oxide layer 30, as shown in FIG. 4b. The native oxide 30 may comprise AlO, which is in an unstable chemical state, since there am unpaired molecules (the stable chemical configuration is $Al_2O_3$). Exposure to $NH_3$ may result in some bonding of N to the Al atoms in the native oxide 30, changing the composition of the native oxide 30 to AlON. The result of the invention is the mechanical strengthening of the aluminum leads 16.

The novel method of applying a strengthened shell over aluminum leads to enhance reliability of the leads is beneficial to semiconductors having low-dielectric constant materials. Without first strengthening the aluminum leads with a strengthened shell, the aluminum leads can lack the mechanical strength required to yield a sufficient amount of functional devices per wafer. Low dielectric constant materials have been found to have low structural strength. One advantage of the present invention is to mechanically strengthen the aluminum leads of a semiconductor wafer.

The mechanical properties of the strengthened shell are better than that of unstrengthened aluminum. AlN and $Al_2O_3$ have melting temperatures above 2000° C., which is much higher than the melting of 660° C. for Al. The thermal conductivity of polycrystalline AlN, $Al_2O_3$ and $Si_3N_4$ used to form the strengthening layer is in the order of 30 W/mK at room temperature, which is one order of magnitude higher than $SiO_2$. The thermal conductivity of AlN single crystal is as high as 260 W/mK. The Young's modulus of AlN and $Al_2O_3$ are both approximately $50 \times 10^6$ psi, which is five times the Young's modulus of Al (stress=Young's modulus×strain). $Si_3N_4$ formed by CVD has been used as a passivation layer in microelectronics applications because of its chemical stability, and diffusion barrier properties; and in addition, it has high mechanical strength. Therefore, mechanical benefits of forming the strengthened shell with the above chemistries are evident.

Another advantage of the present invention is that it is an intrinsic operation, rather than extrinsic. The method involves exposing the wafer to a gas, rather than depositing a substance on the wafer. The basic material required is already present on the wafer; it is merely altered. The benefits of an intrinsic process include a cleaner operation than a deposition process, no additional material or layers added to the wafer, and ease of incorporating the process into a cluster tool. A cluster tool provides in situ transfer capability, which eliminates exposing the wafer to oxygen between steps.

While the invention has been described with reference to illustrative embodiments, this description is not intended to be construed in a limiting sense. Various modifications and combinations of the illustrative embodiments, as well as other embodiments of the invention, will be apparent to persons skilled in the art upon

What is claimed is:

1. A method for enhancing reliability of aluminum leads of a semiconductor device having a substrate, comprising the steps of:
   depositing an aluminum layer on said substrate;
   etching said aluminum layer in predetermined pattern to form aluminum leads;
   exposing said aluminum leads to a strengthening gas to react with said aluminum leads and form a strengthened shell on said aluminum leads; and
   depositing a dielectric layer over said strengthened shell and said substrate, said dielectric layer providing a dielectric constant of less than 3 in a region between at least two of said aluminum leads, whereby the lack of strength of the dielectric material is compensated by stronger aluminum leads.

2. The method of claim 1 wherein said gas contains nitrogen.

3. The method of claim 1 wherein said gas contains oxygen.

4. The method of claim 1 wherein said exposing said aluminum layer step also comprises a rapid thermal anneal.

5. The method of claim 1 wherein said strengthened shell comprises nitrogen and is 10–100 Å thick.

6. The method of claim 1 Wherein said strengthened shell comprises oxygen and is 40–100 Å thick.

7. The method of claim 1 wherein said aluminum leads have an aspect ratio greater than 1.

8. A method for enhancing reliability of aluminum leads of a semiconductor device having a substrate, comprising the steps of:
   depositing an insulating layer on said substrate;
   depositing an aluminum layer on said insulating layer;
   etching said aluminum layer in a predetermined pattern to form aluminum leads, wherein portions of said insulating layer are exposed;
   exposing said aluminum leads and said exposed portions of said insulating layer to a strengthening gas in order to react and form a strengthened shell on said aluminum leads and a strengthened insulating layer on said exposed portions of said insulating layer; and
   depositing a dielectric layer over said strengthened shell and said strengthened insulating layer, said dielectric layer providing a dielectric constant of less than 3 in a region between at least two of said aluminum leads, whereby the lack of strength of the dielectric material is compensated by stronger aluminum leads.

9. The method of claim 8 wherein said gas contains nitrogen.

10. The method of claim 8 wherein said gas contains oxygen.

11. The method of claim 8 wherein said exposing step also comprises a rapid thermal anneal.

12. The method of claim 8 wherein said strengthened shell and said strengthened insulating layer comprise nitrogen and are 10–100 Å thick.

13. The method of claim 8 wherein said strengthened shell and said strengthened insulating layer comprise oxygen and are 40–100 Å thick.

14. The method of claim 8 wherein said aluminum leads have an aspect ratio greater than 1.

* * * * *